(12) United States Patent
Rhee et al.

(10) Patent No.: US 8,048,800 B2
(45) Date of Patent: Nov. 1, 2011

(54) FABRICATION METHOD OF TWO-TERMINAL SEMICONDUCTOR COMPONENT USING TRENCH TECHNOLOGY

(75) Inventors: Jin-Koo Rhee, Seoul (KR); Seong-Dae Lee, Seoul (KR); Mi-Ra Kim, Seoul (KR); Dae-Hong Min, Seoul (KR); Wan-Joo Kim, Daejeon (KR)

(73) Assignee: Dongguk University Industry—Academic Corporation Foundation, Seoul (KR)

( * ) Notice: Subject to any disclaimer, the term of this patent is extended or adjusted under 35 U.S.C. 154(b) by 104 days.

(21) Appl. No.: 12/603,766

(22) Filed: Oct. 22, 2009
(Under 37 CFR 1.47)

(65) Prior Publication Data
US 2011/0059609 A1    Mar. 10, 2011

(30) Foreign Application Priority Data
Oct. 24, 2008    (KR) .................. 10-2008-0105029

(51) Int. Cl.
*H01L 21/44*    (2006.01)
*H01L 21/311*    (2006.01)

(52) U.S. Cl. ......... 438/665; 438/669; 438/677; 438/679; 438/680; 438/694

(58) Field of Classification Search .................. None
See application file for complete search history.

(56) References Cited

U.S. PATENT DOCUMENTS
4,339,870 A * 7/1982 Ball et al. ............... 438/403
* cited by examiner

*Primary Examiner* — Scott B Geyer
(74) *Attorney, Agent, or Firm* — Grossman Tucker Perreault & Pfleger, PLLC

(57) ABSTRACT

A method of fabricating a two-terminal semiconductor component using a trench technique is disclosed that includes forming a trench by etching an etching pattern formed on a substrate on which an active layer having impurities added is grown, forming a front metal layer on a front upper surface of the substrate by using an evaporation method or a sputtering method after removing the etching pattern, forming a metal plated layer on the front surface of the substrate on which the front metal layer is formed, polishing a lower surface of the substrate by using at least one of a mechanical polishing method and a chemical polishing method until the front metal layer is exposed, forming a rear metal layer on the polished substrate, and removing each component by using at least one of a dry etching method and a wet etching method.

14 Claims, 3 Drawing Sheets

FABRICATION METHOD OF TWO-TERMINAL SEMICONDUCTOR COMPONENT USING TRENCH TECHNOLOGY

CROSS-REFERENCE TO RELATED APPLICATIONS

This application claims the benefit of Korean Patent Application No. 10-2008-0105029, filed with the Korean Intellectual Property Office on Oct. 24, 2008, the disclosure of which is incorporated herein by reference in its entirety.

BACKGROUND

1. Technical Field

The following description relates to a method of fabricating a two-terminal semiconductor component that consists of two electrodes, more specifically to a method of fabricating a semiconductor component having two terminals that can minimize the deviation in thickness during the polishing process of a semiconductor substrate and have higher reproducibility of a thinner substrate than the polishing process.

2. Description of the Related Art

Two-terminal electronic components that can be fabricated using a semiconductor include diodes, resistors, capacitors, inductors and the like. Among these, the diode is the most common active component and is employed in various circuits, such as rectifiers, oscillators and the like.

Recently, studies are underway to develop an oscillator having a high frequency band using diodes for microwaves and millimeter-waves, for example, Gunn diodes, Tunnel diodes, Impact ionization Avalanche Transit Time (IMPATT) diodes and the like.

These diodes for microwaves can convert a direct current (DC) to an alternating current (AC) by using negative differential resistance that is generated by the physical properties of a semiconductor material used for fabrication. Also, since the diodes have higher output power and lower noise characteristics than a field effect transistor (FET), these components are commonly used in circuits of an oscillator for a millimeter-wave band of 30 GHz or greater. In order to fabricate these diodes for microwaves and millimeter-waves, a semiconductor material such as gallium-arsenic (GaAs), gallium-nitride (GaN) or indium-phosphide (InP) is used. The carrier concentration and thickness of the semiconductor material may be determined according to the frequency specifications of the oscillator circuit.

Generating an alternating signal in the millimeter-wave band region generally requires the semiconductor material to have a carrier concentration of $10^{16}$ atoms per cubic centimeter (atoms/cm$^3$) and a thickness of a few micrometers or less (1 μm=$10^{-6}$ m). Used in order to fabricate these diodes for the millimeter-wave band region is a thick semiconductor substrate, on which a semiconductor material with the above-described carrier concentration and thickness is grown.

These diodes may generate a lot of heat in the materials during the operation, and the generated heat may deteriorate the properties of the components. To effectively dissipate the heat, a thinner substrate with the thickness of a few or a few tens of micrometers is used, and the diodes are adhered to a heat sink that is made of metals such as gold (Au) and copper (Cu) or materials with high thermal conductivity. The substrate is made thinner particularly for the purpose of, in addition to efficient heat dissipation, improving the property of the components by lowering series resistance of the substrate.

However, when the substrate is thinner, it is impossible to fabricate a component on the substrate, and thus GaAs or InP substrates require the thickness of 600 μm or greater for the diameter of 3 inches or greater. Thus, to make the substrate thinner, the substrate is mechanically or chemically lapped and polished. Generally, the diodes are fabricated with the thickness of 50 μm or less so as to lower the series resistance and dissipate the heat effectively.

Lapping and polishing the substrate of the thickness of 50 μm or less with the thickness deviation of 1 μm or less is a very precise and careful process. Moreover, it is not technically easy to consistently repeat the fabrication of a semiconductor component with the thickness of 50 μm or less within a minimal error range.

SUMMARY

Exemplary embodiments may provide a method of fabricating a two-terminal semiconductor component by using a trench technique that uses an etching method to lap and polish a semiconductor substrate for the improvement of the component properties through the reduction of series resistance and the improvement of heat dissipation of the semiconductor component.

Exemplary embodiments also may provide a method of fabricating a two-terminal semiconductor component that minimizes the deviation in thickness in a lapping and polishing process of a semiconductor substrate and has high reproducibility of a wafer polishing process for a thinner substrate and high uniformity in thickness for the wafer.

In one general aspect, a method of fabricating a two-terminal semiconductor component using a trench technique includes forming a trench by etching an etching pattern formed on a substrate on which an active layer having impurities added is grown, forming a front metal layer on a front upper surface of the substrate by using an evaporation method or a sputtering method after removing the etching pattern, forming a metal plated layer on the front surface of the substrate on which the front metal layer is formed, in which the metal plated layer is thicker than a side of the trench, polishing a lower surface of the substrate by using at least one of a mechanical polishing method and a chemical polishing method until the front metal layer is exposed, forming a rear metal layer on the polished substrate, in which the rear metal layer is for forming a metal electrode, and removing each component by using at least one of a dry etching method and a wet etching method.

The forming of the trench can further include washing the substrate on which the active layer is grown, before forming the trench.

In the forming of the trench, the etching pattern can be formed by using a lithography process.

In the forming of the metal plated layer, the metal plated layer can be formed with a thickness of 40 μm or greater.

In the polishing of the lower surface of the substrate, the polishing can be performed until the substrate becomes 50 μm or less in thickness.

The polishing of the lower surface of the substrate can include polishing the lower surface of the substrate by using a mechanical polishing process, and polishing the lower surface of the substrate by using a chemical polishing process in addition to the mechanical polishing process when the overall thickness of the polished substrate becomes a predetermined thickness of greater than 50 μm.

In the forming of the rear metal layer, the rear metal layer can be formed by using a lift-off process by way of an image reversal (IR) process or a negative lithography process, or by forming a metal layer on the front surface and then etching off unnecessary portions.

Additional aspects and advantages of the present invention will be set forth in part in the description which follows, and in part will be obvious from the description, or may be learned by practice of the invention.

DETAILED DESCRIPTION

The features and advantages of this invention will become apparent through the below drawings and description.

A method of fabricating a two-terminal semiconductor component using a trench technique according to a certain embodiment of the present invention will be described below in more detail with reference to the accompanying drawings. This, however, is by no means to restrict the present invention to this embodiment, and shall be construed as including all permutations, equivalents and substitutes covered by the spirit and scope of the present invention. This embodiment presented in the description is intended to implement the present invention and to show those of ordinary skill in the art the scope of the present invention only.

FIGS. 1A to 1G illustrate the flow of fabricating a two-terminal semiconductor component according to an embodiment of the present invention.

Figure 1A:
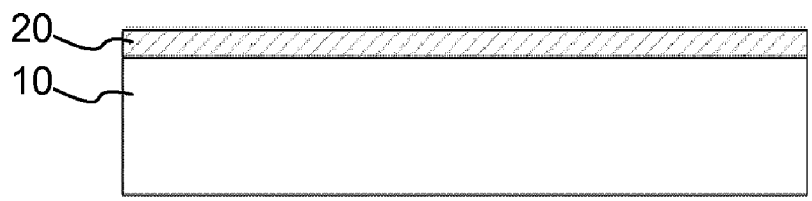
FIGS. 1A to 1G illustrate the flow of fabricating a two-terminal semiconductor component in accordance with an embodiment of the present invention.

Referring to FIG. 1A, an active layer 20 with an appropriate amount of impurities is grown on a semiconductor substrate 10 so that a two-terminal semiconductor component can operate, and then the semiconductor substrate 10 having the active layer 20 formed thereon is washed. Here, the semiconductor substrate 10 can be washed by using various organic solvents, for example, trichloroethylene (TCE), acetone and isopropyl alcohol (IPA), and chemical solutions, for example, hydrochloric acid (HCl) and hydrogen fluoride (HF).

Figure 1B:
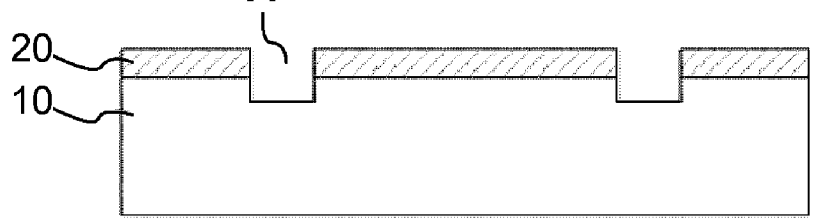

Then, as shown in FIG. 1B, a trench 30 is formed by way of dry or wet etching an etching pattern formed on the active layer 20 of the washed substrate 10. Here, the etching pattern is formed by a lithography process, which can be either a positive lithography process or a negative lithography process depending on the application. The etching process for forming the trench 30 can be either wet etching using a chemical etching solution or dry etching using plasma.

Although the wet and dry etching processes have different etching ratios according to the etching method and solution or gas used, such processes have a uniform depth of the etched trench and high compatibility of reproducibility between the processes.

Figure 1C:
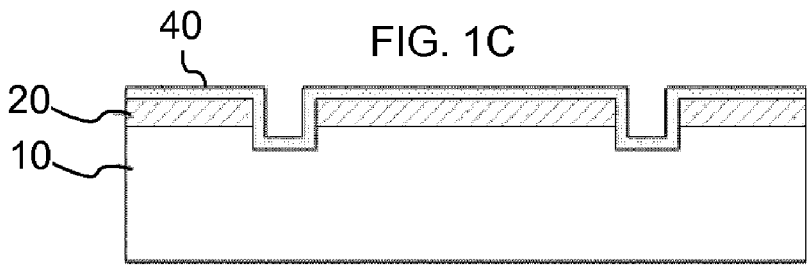

Then, as illustrated in FIG. 1C, a front metal layer 40 is formed, after the etching pattern for forming the trench 30 is removed, in order to form a metal electrode. Here, the front metal layer 40 can be formed by using an evaporation or sputtering method, and an ohmic metal layer, which allows the flow of electrons in both directions between a metal and a semiconductor, or a rectifying Schottky metal layer, which allows the flow of electrons in one direction only between the metal and the semiconductor, is formed depending on the use. The metal layer is also formed on the inside of the trench 30.

Figure 1D:
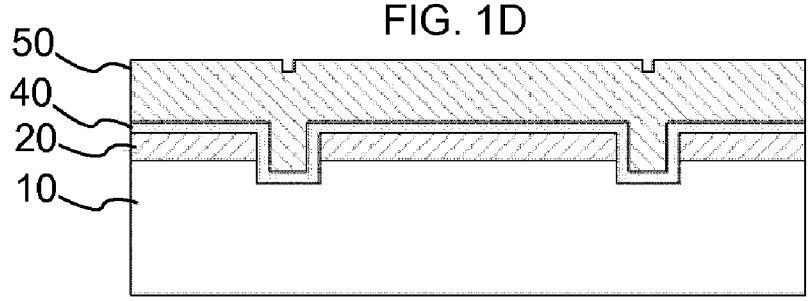

Then, as shown in FIG. 1D, a thick metal plated layer 50 is formed for an easier handling of a heat sink, which helps for effective heat dissipation, and a wafer, which has become thinner after the polishing of the substrate. Here, the metal plated layer 50 can be formed by way of electroplating, in which electric current is applied, or electroless plating, in which electric current is not used. For easier handing of a thin wafer, a metal plated layer with the thickness of 40 μm or greater is required, and the electroplating method is commonly used for forming such thick metal layer. Moreover, metals being used in plating can include gold (Au), silver (Ag), copper (Cu) and the like, while gold is commonly used because it is little oxidized due to its chemical stability and has high thermal and electrical conductivities.

As such, since the metal for electrode is formed not only on the front surface of the active layer of the wafer but also inside the trench, the metal plated layer 50 is also formed on the front surface of the active layer 20 and inside the trench 30. The metal plated layer 50 formed on the lower portion of the inside of the trench 30 is particularly thicker than that formed on the upper portion of the active layer 20 and the sidewalls of the trench 30 so that further polishing can be prevented during the polishing of the wafer, thereby making the thickness of the wafer generally uniform.

Figure 1E:
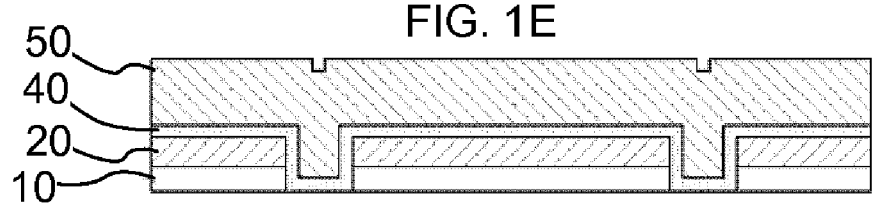

Next, as illustrated in FIG. 1E, a polishing process is performed using a mechanical or chemical method, to make the substrate 10 with the thickness of 50 μm or less. Since it is difficult to use the chemical method to polish the semiconductor substrate with the thickness of 500 μm or greater, the mechanical polishing method is initially used to polish most of the semiconductor substrate, and then the mechanical method is used in conjunction with the chemical method as the target thickness is approached.

Used for the mechanical polishing method is polishing powder including alumina or diamond, of which particles are relatively large, and then polishing powder with relatively smaller particle size is used as the thickness becomes thinner. Then, the polishing process is stopped when the front metal layer 40 and the metal plated layer 50 that are formed in the trench are exposed. Since the etching process for forming the trench 30 has high reproducibility and thickness uniformity, the polishing process can also have high reproducibility and thickness uniformity.

Figure 1F:
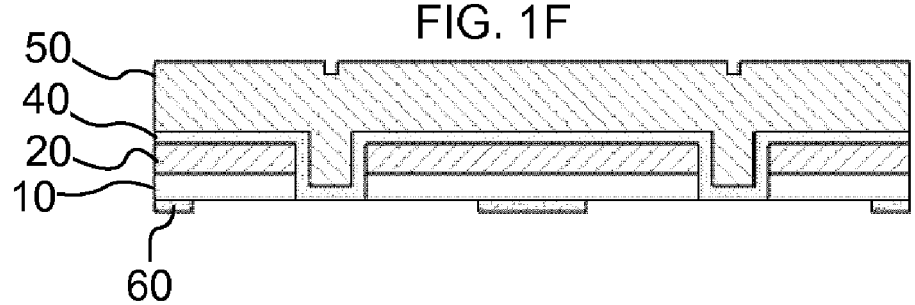

Next, as illustrated in FIG. 1F, a rear metal layer 60 for forming a metal electrode is formed on the semiconductor substrate 10 of the polished wafer. Since it is required that the rear metal layer 60 is formed on some portions of the substrate 10, not on the entire area of the substrate 10, the rear metal layer 60 can be formed by using a lift-off process by way of an image reversal (IR) or negative lithography process, or by forming a metal layer on the front surface and then etching off unnecessary portions.

Like the front metal layer 40, an ohmic or rectifying Schottky metal layer can be formed for the rear metal layer 50 depending on the use of the component.

Figure 1G:
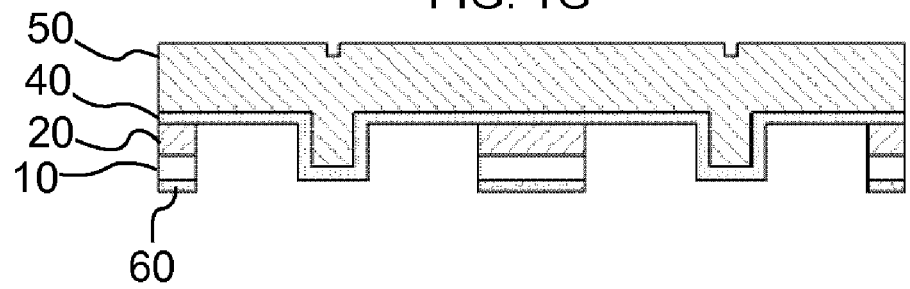

Finally, as illustrated in FIG. 1G, each component is removed using an etching process. Here, the etching process can be either wet etching or dry etching, depending on the material and use of the substrate.

Figure 2:
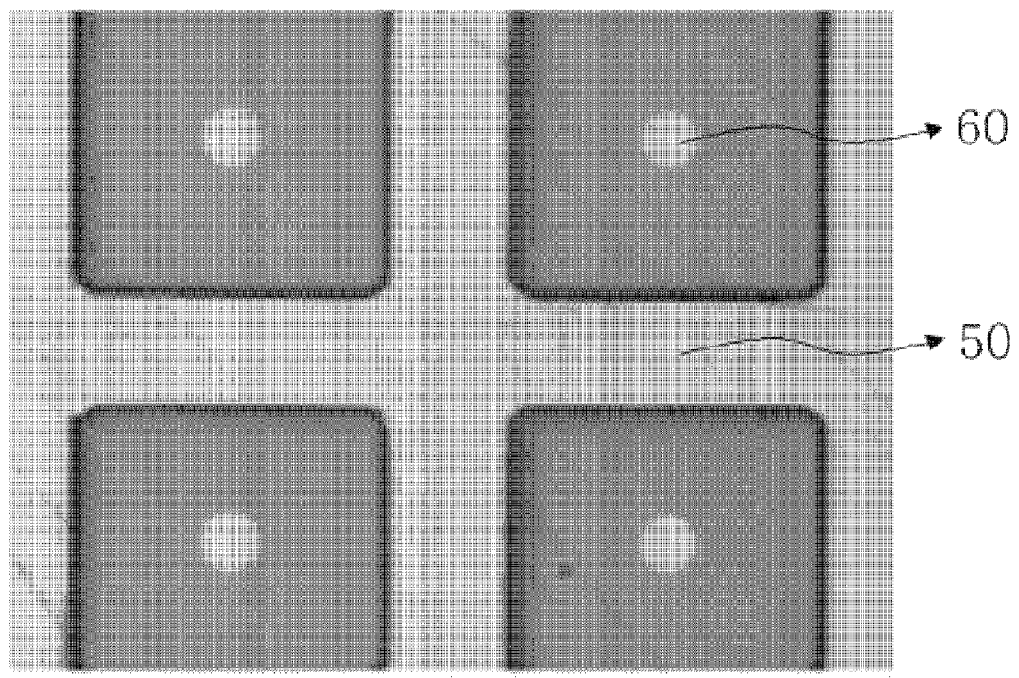
FIG. 2 illustrates an example of the two-terminal semiconductor component fabricated through the steps illustrated in FIGS. 1A to 1G.

FIG. 2 shows an example of the two-terminal semiconductor component that is fabricated through the steps illustrated in FIGS. 1A to 1G.

Referring to FIG. 2, it can be seen that the metal plated layer 50, which is formed by being filled in the trench after the trench is formed, is exposed around the rear metal layer 60 in the polishing process.

As such, the present invention uses a relatively simple etching method in fabricating the two-terminal semiconductor component, thereby improving the reproducibility of the wafer polishing process and the thickness uniformity of the wafer for the improvement of the component properties and heat dissipating effectiveness.

Using an etching method only may require a very complicated technology and a great amount of time and cost to reproduce a consistent thickness and maintain a small deviation in thickness. However, by using the trench method of the present invention to fabricate a semiconductor component, a better etching process with higher reproducibility and thickness uniformity can be implemented, as compared to the conventional fabricating method using an etching process only. Thus, in the wafer polishing process, the reproducibility and thickness uniformity can be readily improved.

Furthermore, since the thick metal plated layer 50, which is formed inside the trench, has a relatively smaller amount polished than the semiconductor substrate during the polishing process, the wafer can be readily polished with a uniform thickness, and the reproducibility between its processes can also be improved.

A method of fabricating a two-terminal semiconductor component using a trench technique according to the above-described example embodiments may be recorded in computer-readable media including program instructions to implement various operations to be executed by a computer. The media may also include, alone or in combination with the program instructions, data files, data structures, etc. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, etc. Examples of program instructions include both machine code, such as produced by a compiler, and files containing higher level code that may be executed by the computer using an interpreter. The described hardware devices may be configured to act as one or more software modules in order to perform the operations of the above-described example embodiments, or vice versa.

While the spirit of the present invention has been described in detail with reference to a particular embodiment, the embodiment is for illustrative purposes only and shall not limit the present invention. It is to be appreciated that those skilled in the art can change or modify the embodiment without departing from the scope and spirit of the present invention.

As such, many embodiments other than that set forth above can be found in the appended claims.

What is claimed is:

1. A method of fabricating a two-terminal semiconductor component using a trench technique, comprising:
    forming a trench by etching an etching pattern formed on a substrate on which an active layer having impurities added is grown;
    forming a front metal layer on a front upper surface of the substrate by using an evaporation method or a sputtering method after removing the etching pattern;
    forming a metal plated layer on the front surface of the substrate on which the front metal layer is formed, the metal plated layer being thicker than a side of the trench;
    polishing a lower surface of the substrate by using at least one of a mechanical polishing method and a chemical polishing method until the front metal layer is exposed;
    forming a rear metal layer on the polished substrate, the rear metal layer being for forming a metal electrode; and
    removing each component by using at least one of a dry etching method and a wet etching method.

2. The method of claim 1, wherein the forming of the trench further comprises washing the substrate on which the active layer is grown, before forming the trench.

3. The method of claim 2, wherein the washing of the substrate is performed by using an organic solvent and a chemical solution.

4. The method of claim 3, wherein the organic solvent is trichloroethylene (TCE), acetone, or isopropylalcohol (IPA).

5. The method of claim 3, wherein the chemical in the chemical solution is hydrochloric acid (HCl) or hydrogen fluoride (HF)

6. The method of claim 1, wherein, in the forming of the trench, the etching pattern is formed by using a lithography process.

7. The method of claim 1, wherein, in the forming of the trench, the etching is performed by wet etching using a chemical etching solution or dry etching using plasma.

8. The method of claim 1, wherein, in the forming of the metal plated layer, the metal plated layer is formed by way of electroplating or electroless plating, the electroplating using electric current, the electroless plating using no electric current.

9. The method of claim 8, wherein the metal plated layer is made of a metal selected from the group consisting of gold (Au), silver (Ag) and copper (Cu).

10. The method of claim 1, wherein, in the forming of the metal plated layer, the metal plated layer is formed with a thickness of 40 μm or greater.

11. The method of claim 1, wherein, in the polishing of the lower surface of the substrate, the polishing is performed until the substrate becomes 50 μm or less in thickness.

12. The method of claim 11, wherein the polishing of the lower surface of the substrate comprises:
    polishing the lower surface of the substrate by using a mechanical polishing process; and
    polishing the lower surface of the substrate by using a chemical polishing process in addition to the mechanical polishing process when the overall thickness of the polished substrate becomes a predetermined thickness of greater than 50 μm.

13. The method of claim 1, wherein, in the forming of the rear metal layer, the rear metal layer is formed by using a lift-off process by way of an image reversal (IR) process or a negative lithography process, or by forming a metal layer on the front surface and then etching off unnecessary portions.

14. A computer readable recording medium encoded with a computer program causing a computer to execute the method, comprising:
    forming a trench by etching an etching pattern formed on a substrate on which an active layer having impurities added is grown;
    forming a front metal layer on a front upper surface of the substrate by using an evaporation method or a sputtering method after removing the etching pattern;
    forming a metal plated layer on the front surface of the substrate on which the front metal layer is formed, the metal plated layer being thicker than a side of the trench;

polishing a lower surface of the substrate by using at least one of a mechanical polishing method and a chemical polishing method until the front metal layer is exposed;

forming a rear metal layer on the polished substrate, the rear metal layer being for forming a metal electrode; and removing each component by using at least one of a dry etching method and a wet etching method.

* * * * *